(12) United States Patent
Tsukamoto et al.

(10) Patent No.: US 10,651,837 B2
(45) Date of Patent: May 12, 2020

(54) POWER SUPPLY DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Katsuma Tsukamoto, Mie (JP); Yusuke Yano, Mie (JP); Keisuke Wakazono, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 366 days.

(21) Appl. No.: 15/552,559

(22) PCT Filed: Feb. 5, 2016

(86) PCT No.: PCT/JP2016/053441
§ 371 (c)(1),
(2) Date: Aug. 22, 2017

(87) PCT Pub. No.: WO2016/136422
PCT Pub. Date: Sep. 1, 2016

(65) Prior Publication Data
US 2018/0034458 A1 Feb. 1, 2018

(30) Foreign Application Priority Data
Feb. 26, 2015 (JP) .................................. 2015-036856

(51) Int. Cl.
*H02H 3/00* (2006.01)
*H03K 17/0812* (2006.01)
(Continued)

(52) U.S. Cl.
CPC ... *H03K 17/08122* (2013.01); *G01R 31/3277* (2013.01); *H02H 3/044* (2013.01);
(Continued)

(58) Field of Classification Search
None
See application file for complete search history.

(56) References Cited

U.S. PATENT DOCUMENTS 5,762,573 A * 6/1998 Kennedy, III ......... A63B 45/02
40/327
9,473,028 B1 * 10/2016 Hoyt ..................... H02M 3/158
(Continued)

FOREIGN PATENT DOCUMENTS

| JP | H02-086210 A | 3/1990 |
|----|--------------|--------|
| JP | 2001-189650 A | 7/2001 |
| JP | 2007134780 A | 5/2007 |

OTHER PUBLICATIONS

Search Report for PCT/JP2016/053441.

*Primary Examiner* — Stephen W Jackson
(74) *Attorney, Agent, or Firm* — Honigman LLP

(57) ABSTRACT

Provided is a power supply device configured to diagnose circuit operation, and identify, if a defect is found in the diagnosis, the circuit component that is the cause. The power supply device includes: a switch that is disposed in a power supply path leading from a main power source to a load, and is configured to bring into conduction and interrupt the power supply path; a downstream sensing means for sensing a power supply state of a load-side power supply path between the switch and the load; a comparing means for comparing a downstream voltage of the load-side power supply path, with a predetermined threshold voltage; and a control unit. The control unit includes: a switch control means for turning the switch on/off; and a conduction
(Continued)

determination means for determining whether the switch is in an ON or OFF state based on the output of the downstream sensing means.

8 Claims, 4 Drawing Sheets

(51) Int. Cl.
  *H03K 17/082*    (2006.01)
  *G01R 31/327*    (2006.01)
  *H02H 3/04*     (2006.01)
  *H02H 3/05*     (2006.01)
  *H02H 3/08*     (2006.01)
  *H03K 5/24*     (2006.01)
  *G01R 31/40*     (2020.01)
  *H02H 3/087*     (2006.01)
  *G01R 31/00*     (2006.01)
  *H02H 1/00*     (2006.01)

(52) U.S. Cl.
  CPC ............. *H02H 3/05* (2013.01); *H02H 3/08* (2013.01); *H03K 5/24* (2013.01); *H03K 17/0822* (2013.01); *G01R 31/006* (2013.01); *G01R 31/40* (2013.01); *H02H 1/0007* (2013.01); *H02H 3/087* (2013.01); *H03K 2217/0027* (2013.01)

(56) References Cited

U.S. PATENT DOCUMENTS

| | | | |
|---|---|---|---|
| 9,640,972 B2 * | 5/2017 | Kreuter | ............... H01H 83/00 |
| 2007/0103832 A1 | 5/2007 | Ohshima | |
| 2008/0180039 A1 * | 7/2008 | Masuko | ............ H05B 33/0815 |
| | | | 315/291 |

* cited by examiner

POWER SUPPLY DEVICE

CROSS-REFERENCE TO RELATED APPLICATIONS

This application is the U.S. national stage of PCT/JP2016/053441 filed Feb. 5, 2016, which claims priority of Japanese Patent Application No. JP 2015-036856 filed Feb. 26, 2015.

TECHNICAL FIELD

The present invention relates to a power supply device provided with an overcurrent interruption mechanism, and relates in particular to a technique for identifying a failed component of the device.

BACKGROUND

Conventionally, electric power supply devices are provided that include a semiconductor switch disposed in a power supply path leading from an electric power source to a load, and turn the semiconductor switch on/off to switch the conduction state of the power supply path. Such power supply devices encompass a power supply device that is provided with an overcurrent interruption mechanism. "Overcurrent interruption mechanism" refers to a mechanism that senses an overcurrent when it flows through the power supply path, and automatically turns the semiconductor switch off to interrupt the current flowing through the power supply path, thereby protecting the semiconductor switch itself and the load connected thereto.

JP 2007-134780A discloses a load driving device that drives an electric component installed in a vehicle. The load driving device includes, in a power supply path through which electric power is supplied from an electric power source to a load, a MOSFET that is arranged in series to the power supply path, and serves as a switch for switching the conduction state of the power supply path. A drain-source voltage of the MOSFET is compared with a predetermined threshold voltage by a comparator. An output terminal of the comparator and the MOSFET are connected to a control circuit, and, upon detecting that the magnitude relationship of the drain-source voltage to the threshold voltage is inverted from that of the normal time, the control circuit determines that an overcurrent has occurred, and automatically turns the MOSFET off. Furthermore, the load driving device of JP 2007-134780A uses several types of resistors having different resistance values to switch the threshold voltage stepwise, and determine several times whether or not an overcurrent has actually occurred, in order to prevent erroneously determining a temporary increase in the amount of current that occurs in normal operation such as an incoming current occurring when the load starts to operate, as an overcurrent.

Furthermore, the load driving device of JP 2007-134780A has a function to diagnose a fault of the overcurrent interruption mechanism. Such diagnosis is performed, when the power supply path is in conduction, such that the device is switched to a diagnosis mode to prevent interruption of power supply to the load, then the resistor that is arranged on an input wire of the comparator is switched so that the threshold voltage increases or the drain-source voltage decreases on a trial basis, and whether the magnitude relationship of these voltages is inverted is checked.

However, in the above-described diagnosis method, even if an operation defect of the overcurrent interruption mechanism is found, it is not possible to identify whether this is a fault of the switch that switches a resistor or a fault of the comparator itself. Therefore, if a defect is found in the above-described diagnosis, there is nothing to be done but perform a standard measure to turn the MOSFET off to interrupt power supply to the load.

Furthermore, in the diagnosis, it is not possible to detect a short-circuit fault of the MOSFET. A short-circuit fault of the switch, which opens and closes the power supply path, is a fault that may lead to a worst case scenario such as a burnout or fire of the load when an overcurrent has occurred, and is also a fault in which fail-safe or fail-soft implementation is difficult because it is not possible to interrupt the power supply path.

In view of the above-described problems, it is an object of the present invention to provide a power supply device that has a function to diagnose circuit operation, and can identify, if a defect is found in the diagnosis, a circuit component that is the cause thereof.

SUMMARY

In order to solve the above-described problems, according to the present invention, a power supply device includes: a switch that is disposed in a power supply path leading from a main power source to a load, and is configured to bring into conduction and interrupt the power supply path; a downstream sensing means for sensing a power supply state of a load-side power supply path, which is a power supply path between the switch and the load; a comparing means for comparing a downstream voltage, which is a voltage of the load-side power supply path, with a predetermined threshold voltage; and a control unit to which outputs of the downstream sensing means and the comparing means are input, wherein the control unit includes: a switch control means for turning the switch on/off; and a conduction determination means for determining whether the switch is in an ON or OFF state based on the output of the downstream sensing means.

As a result of the downstream sensing means for sensing the power supply state of the load-side power supply path being provided separately, it is possible to directly determine whether or not the switch has correctly reacted in response to the switch control means having turned on and off the switch, based on the power supply state of the load-side power supply path. In other words, if a presumed state of the switch and an output of the comparator are inconsistent, then it is possible to determine whether this is caused by a fault of the switch or a fault of the comparator. Accordingly, it is possible to automatically take the most appropriate protection measure depending on, for example, the failed component or the degree of risk of the fault state, and furthermore, it is possible to reduce man-hour necessary for identifying a failed component when it is repaired.

Furthermore, preferably, the power supply device is such that the control unit further includes an overcurrent sensing means for causing the switch control means to turn the switch off, upon sensing that the downstream voltage is lower than the threshold voltage.

The power supply device of the present invention has a configuration of capable of detecting faults of the comparing means and the switch in advance, and thus it is possible to reduce erroneous detection of an overcurrent.

Furthermore, preferably, the power supply device is such that the control unit further includes an interruption diagnosis means for determining, in a case where the comparing means indicates that the downstream voltage is higher than the threshold voltage after the switch is turned off by the switch control means, that the switch has a defect if the conduction determination means determines that the switch is in the ON state, and determining that the comparing means has a defect if the conduction determination means determines that the switch is in the OFF state.

When the switch is turned off and the power supply path is interrupted, the resistance value of the switch is infinite, and thus the input voltage (downstream voltage) from the main power source to the comparing means connected to the load-side power supply path is 0[V]. Accordingly, the output thereof should indicate that the voltage of the load-side power supply path is lower than the threshold voltage as long as the operation of the comparing means is normal. If, at this time, the comparing means indicates the inverted output, it is presumed that the output of the comparator or the state of the switch has a defect. Here, the downstream sensing means determines the power supply state of the load-side power supply path, and if a voltage of the main power source that actually should have not been applied to the load-side power supply path is detected from the load-side power supply path, it is possible to determine that the switch has a short-circuit fault, and if the operation of the switch is normal (no voltage of the main power source is detected from the load-side power supply path), then it is possible to determine that the output of the comparing means is inconsistent.

Furthermore, preferably, the power supply device is such that the control unit further includes a conduction diagnosis means for determining, in a case where the comparing means indicates that the downstream voltage is lower than the threshold voltage after the switch is turned on by the switch control means, that the comparing means has a defect if the conduction determination means determines that the switch is in the ON state, and determining that the switch has a defect if the conduction determination means determines that the switch is in the OFF state.

When the switch is turned on and the power supply path is brought into conduction, the on-resistance of the switch decreases the voltage depending on the amount of current flowing through the switch, and increases or decreases the input voltage to the comparing means connected to the load-side power supply path. If the threshold voltage that is compared with such an input voltage is adjusted so as to be lower than the input voltage when the amount of current is normal, then the output of the comparing means should indicate that the input voltage is higher than the threshold voltage. If, at this time, the comparing means indicates the inverted output, it is presumed that the output of the comparator or the state of the switch has a defect (or an overcurrent has actually occurred). Here, the downstream sensing means determines the power supply state of the load-side power supply path, and if a voltage of the main power source that actually should have been applied to the load-side power supply path is not detected from the load-side power supply path, it is possible to determine that the switch has an open-circuit fault (or an overcurrent has actually occurred), and if the operation of the switch is normal (a voltage of the main power source is detected from the load-side power supply path), then it is possible to determine that the output of the comparing means is inconsistent.

Furthermore, preferably, the power supply device further includes: a sub power source connected to the load-side power supply path; and an upstream sensing means for sensing a power supply state of a main power source-side power supply path, which is a power supply path between the switch and the main power source, wherein an output of the upstream sensing means is further input to the control unit, and the conduction determination means determines whether the switch is in the ON or OFF state based on the outputs of the downstream sensing means and the upstream sensing means.

Furthermore, preferably, the power supply device is such that the control unit includes an A/D converter, and the conduction determination means determines whether the switch is in the ON or OFF state based on the outputs of the downstream sensing means and the upstream sensing means that are converted into numeric values by the A/D converter.

As a result of the voltages that were acquired from the power supply path via the downstream sensing means and the upstream sensing means being converted by the A/D converter into numeric values, more fine determination is possible than in the case where determination is performed only based on binary values (Hi (1) and Low (0)) obtained by reducing these voltages using a resistance voltage divider or the like. Particularly, in the configuration in which the sub power source, in addition to the main power source, are connected to the load-side power supply path, the voltage of the main power source is applied to the main power source-side power supply path, and the voltage from the sub power source is applied to the load-side power supply path, making it difficult to determine the ON/OFF state of the switch only based on comparison of the binary values for the voltages of the power supply paths. By the conduction determination means using the A/D converter to convert the voltages of the power supply paths into numeric values, and calculating a change in the voltage value between the main power source-side power supply path and the load-side power supply path quantitatively, it is possible to determine the ON/OFF state of the switch based on the difference.

Advantageous Effects of Invention

According to the present invention, it is possible to provide a power supply device has a function to diagnose circuit operation, and can identify, if a defect is found in the diagnosis, a circuit component that is the cause thereof.

DETAILED DESCRIPTION OF PREFERRED EMBODIMENTS

Configuration Overview

Figure 1:
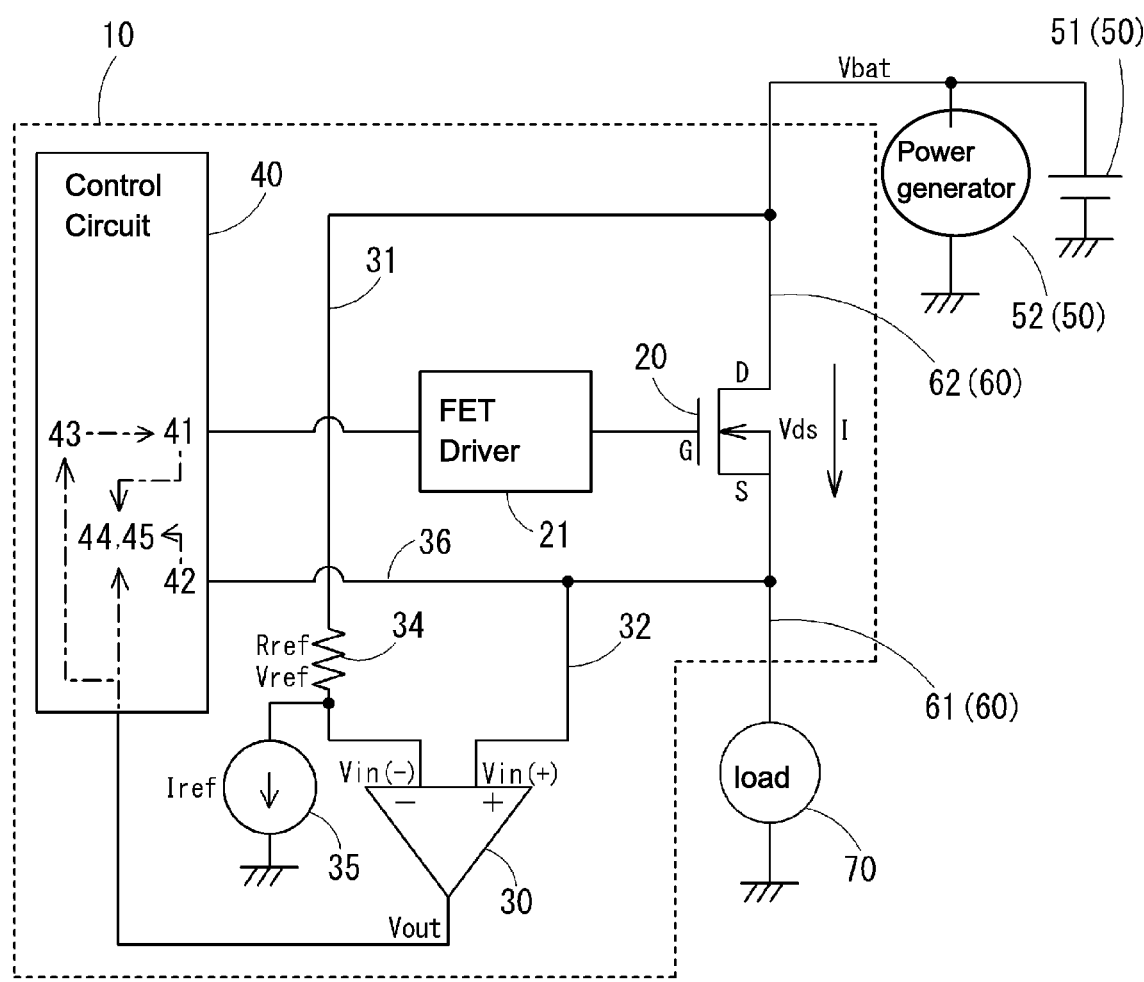
FIG. 1 is a block diagram illustrating an overall configuration of a power supply device.

Hereinafter, embodiments of the present invention will be described with reference to the drawings. FIG. 1 is a block diagram illustrating an overall configuration of a power supply device 10 of the present invention. The power supply device 10 of the present invention is installed in a not-shown vehicle, and controls power supply to a load 70 by using a switch 20 to bring into conduction and interrupt a power supply path 60, which connects a main power source 50 and the load 70. Here, "load 70" means various types of electric components provided in the vehicle. The main power source 50 is a source of electric power for driving such a load 70, and refers to a collective structure including a driving battery 51 and a power generator 52 such as an alternator or a hybrid motor.

In the present embodiment, an n-channel power MOSFET is used as the switch 20 that brings into conduction and interrupts the power supply path 60. A control circuit 40, which serves as a control unit, is provided with a switch control means 41 for turning the switch 20 on/off to switch the conduction state of the power supply path 60. Specifically, the switch control means 41 transmits a signal for turning switch 20 on/off to a MOSFET driver 21, and the MOSFET driver 21 controls a voltage to be applied to a gate terminal G of the switch 20, or its discharge and charge to turn the switch 20 on/off at high speed.

As described above, the switch control means 41 of the present embodiment turns the switch 20 on/off via the MOSFET driver 21, but the MOSFET driver 21 is not an essential structure, and the switch control means 41 may also turn the switch 20 on/off directly. Furthermore, the switch 20 is not limited to an n-channel power MOSFET as in the present embodiment, and may also be a p-channel MOSFET, or another switching element such as a JFET or a bipolar transistor that can perform high speed switching.

A load-side power supply path 61, which is a power supply path between the switch 20 and the load 70, of the power supply path 60 branches into a wiring line 32 that is connected to a non-inverted input terminal (plus input terminal) of a comparator 30, and a downstream sensing means 36, which is a wiring line connected to a conduction determination means 42 of the control circuit 40. The comparator 30 is a comparison means for comparing an input voltage $V_{in(+)}$ that is applied to the plus input terminal from the load-side power supply path 61 with a predetermined threshold voltage $V_{in(-)}$ that is applied to an inverted input terminal (minus input terminal), and outputting information indicating which of the two is larger. Furthermore, the conduction determination means 42 directly acquires a power supply state (voltage in the present embodiment) of the load-side power supply path 61 from the downstream sensing means 36 to determine the ON/OFF state of the switch 20. Note that, in this context, "ON/OFF state of the switch 20" includes an ON state due to a short-circuit fault of the switch 20, and an OFF state due to an open-circuit fault.

An output value $V_{out}$ of the comparator 30 is input to the control circuit 40. A overcurrent sensing and interrupting means 43 monitors the output value $V_{out}$ of the comparator 30 at an interrupt port of the control circuit 40, and when the input voltage $V_{in(+)}$ is lower than the threshold voltage $V_{in(-)}$, the overcurrent sensing and interrupting means 43 causes the switch control means 41 to turn the switch 20 off, and interrupts the power supply path 60.

Overcurrent Interruption Mechanism

Figure 2:
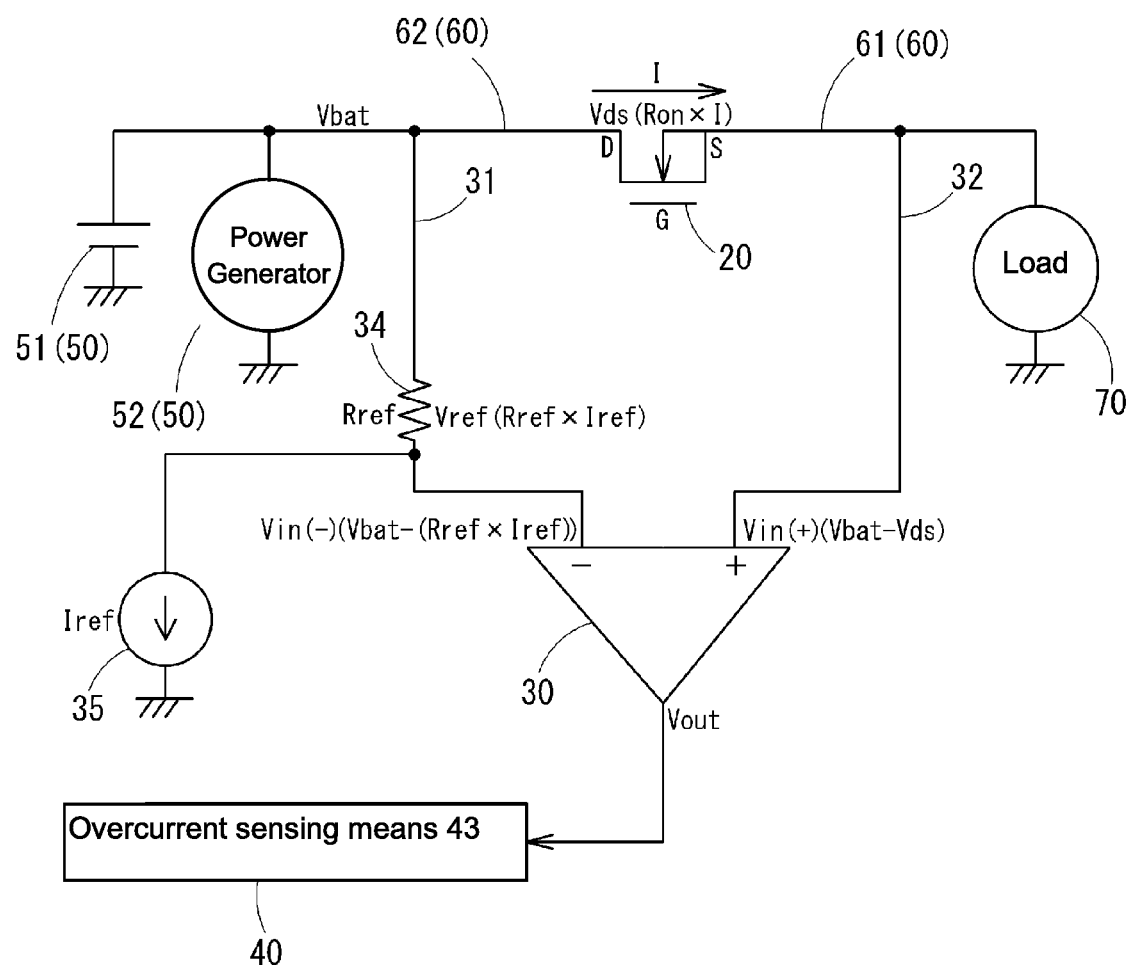
FIG. 2 is a diagram illustrating an overcurrent interruption mechanism of the power supply device.

The following will describe an overcurrent interruption mechanism of the present embodiment in more detail with reference to FIG. 2. The minus input terminal of the comparator 30 is connected to a wiring line 31 that is branched from a main power source-side power supply path 62, which is a power supply path between the switch 20 and the main power source 50, of the power supply path 60. A resistor 34 and a constant current source 35 are connected to the wiring line 31, and a resistance $R_{ref}$ of the resistor 34 and an electric current $I_{ref}$ of the constant current source 35 are constant. Accordingly, a voltage $V_{ref}$ across the resistor 34 (voltage drop from a voltage $V_{bat}$ of the main power source 50) is also constant, and the threshold voltage $V_{in(-)}$ that is applied to the minus input terminal is kept constant. The above-described relation can be expressed in Formula (1).

$$V_{in(-)} = V_{bat} - (R_{ref} \times I_{ref}) \quad (1)$$

The threshold voltage $V_{in(-)}$ is adjusted so as to be lower than the input voltage $V_{in(+)}$ that is applied to the plus input terminal of the comparator 30 if the power supply path 60 is in conduction and an electric current I that is supplied from the main power source 50 to the load 70 is within a range of normal values. Accordingly, when the electric current I is within the range of normal values, then the output value $V_{out}$ of the comparator 30 is Hi.

As the constant current source 35, a constant current diode, a constant current circuit, or the like may be used, for example. Furthermore, in the present embodiment, the threshold voltage $V_{in(-)}$ is generated by the above-described method, but a method for generating the threshold voltage $V_{in(-)}$ is not limited to the above-described method, and any method may be used as long as it is a method in which a constant voltage that is adjustable to a desired value can be generated.

The plus input terminal of the comparator 30 is connected to the wiring line 32 that is branched from the load-side power supply path 61. Because an on-resistance $R_{on}$ of the switch 20 is constant, a drain-source voltage $V_{ds}$ of the switch 20 (the voltage drop from the voltage $V_{bat}$ of the main power source 50) increases with an increase in the electric current I flowing through the switch 20, resulting in a decrease in the input voltage $V_{in(+)}$ that is applied to the plus input terminal of the comparator 30. The above-described relation can be expressed in Formulae (2) and (3) below.

$$V_{ds} = R_{on} \times I \quad (2)$$

$$V_{in(+)} = V_{bat} - V_{ds} \quad (3)$$

If an overcurrent flows through the power supply path 60, then the drain-source voltage $V_{ds}$ increases to above a normal value, so the input voltage $V_{in(+)}$ of the comparator 30 decreases below the threshold voltage $V_{in(-)}$, and the output value $V_{out}$ is inverted from Hi to Low. Upon detecting this change, the overcurrent sensing and interrupting means 43 that monitors the output value $V_{out}$ of the comparator 30 causes the switch control means 41 to turn the switch 20 off, and interrupts the power supply path 60.

Figure 3:
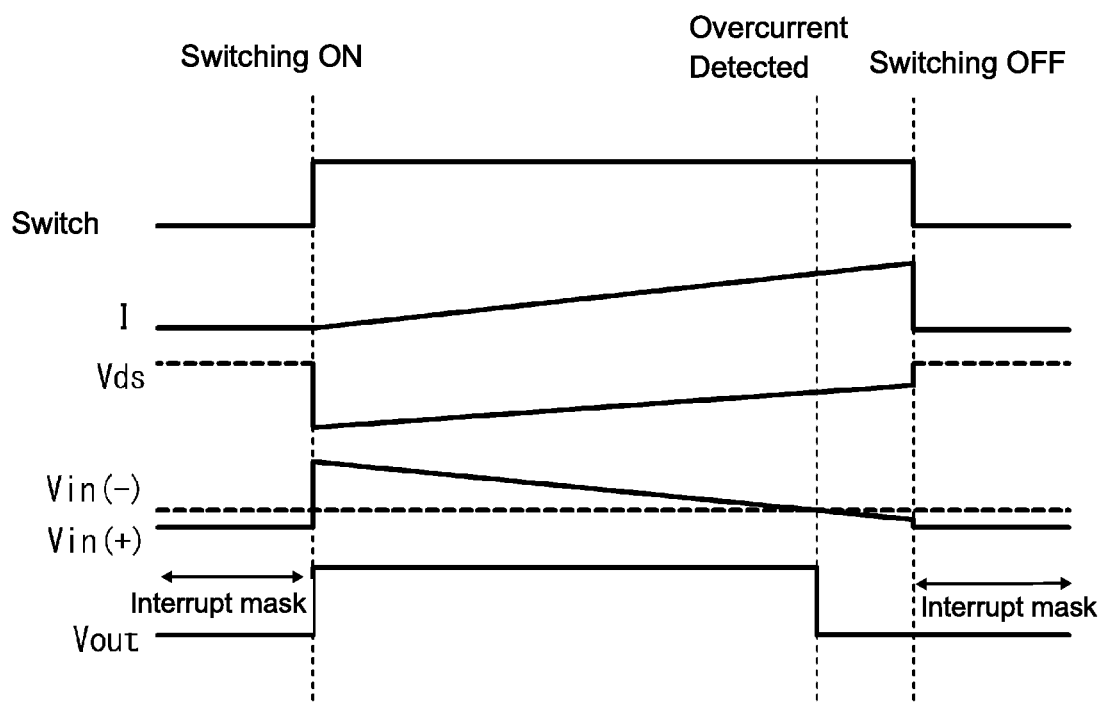
FIG. 3 is a timing diagram illustrating an overcurrent interruption operation performed by the power supply device.

FIG. 3 is a timing diagram illustrating an overcurrent interruption operation performed by the power supply device 10. Because the switch 20 is in the OFF state when the power supply device 10 is started, the resistance value of the switch 20 is infinite, and no electric current I flows through the switch 20. Accordingly, the threshold voltage $V_{in(-)}$ of the comparator 30 is necessarily larger than the input voltage $V_{in(+)}$, and the output value $V_{out}$ of the comparator 30 is Low. In the power supply device 10 of the present embodiment, when the output value $V_{out}$ of the comparator 30 is Low, this essentially means occurrence of an overcurrent. Therefore, when the switch 20 is in the OFF state, an interrupt mask is applied to the interrupt port of the control circuit 40 to prevent erroneous detection of an overcurrent.

When the switch 20 is turned on by the switch control means 41, the electric current I starts to flow through the switch 20, and the input voltage $V_{in(+)}$ is applied to the plus input terminal of the comparator 30. Accordingly, the input voltage $V_{in(+)}$ becomes larger than the threshold voltage $V_{in(-)}$ at the minus input terminal, and the output value $V_{out}$ is switched to Hi.

As expressed in Formula (2), an increase in the electric current I flowing through the switch 20 increases the drain-source voltage $V_{ds}$. As expressed in Formula (3), with the increase in the drain-source voltage $V_{ds}$, an amount of voltage drop across the on-resistance $R_{on}$ of the switch 20 increases as well, and thus the input voltage $V_{in(+)}$ that is applied to the plus input terminal of the comparator 30 decreases. Then, when the electric current I exceeds a predetermined value (when the electric current I reaches an overcurrent range), the magnitude relationship between the input voltage $V_{in(+)}$ of the comparator 30 and the threshold voltage $V_{in(-)}$ is reversed, and the output value $V_{out}$ of the comparator 30 is switched to Low.

Upon detecting the above-described change, the overcurrent sensing and interrupting means 43 that monitors the output value $V_{out}$ of the comparator 30 causes the switch control means 41 to turn the switch 20 off, and brings the power supply path 60 into an interrupted state to interrupt the electric current I. Note that, in FIG. 3, for the sake of description, there is a large interval between the timing of "overcurrent detection" and the timing of "switching off", but these timings shift instantaneously in reality.

Fault Diagnosis

The following will describe a fault diagnosis method of the power supply device 10 according to the present embodiment. Fault diagnosis is executed periodically by a timer interrupt of the control circuit 40, or is executed in tandem with turning on/off of the switch 20.

Fault Diagnosis when Power Supply Path is Interrupted

Fault diagnosis that is performed after the switch 20 is turned off by the switch control means 41 and before the switch 20 is turned on is performed by an interruption diagnosis means 44 provided in the control circuit 40. When the switch 20 is turned off by the switch control means 41, and the power supply path 60 is interrupted, the input voltage $V_{in(+)}$ that is applied to the plus input terminal of the comparator 30 from the main power source 50 is 0[V]. Accordingly, the output value $V_{out}$ thereof should be Low indicating that the input voltage $V_{in(+)}$ is lower than the threshold voltage $V_{in(-)}$, as long as the operation of the comparator 30 is normal. If, at this time, the output value $V_{out}$ is Hi, which is the inverted output, it is presumed that a defect has occurred in the switch 20 or the comparator 30. Note that there is a possibility of a residual voltage being still detected from the load-side power supply path 61 immediately after the switch 20 is turned off, and thus it is preferable that the diagnosis be performed after a given length of time has elapsed since the switch 20 is turned off.

Upon detecting the defect, the interruption diagnosis means 44 checks the actual ON/OFF state of the switch 20 using the conduction determination means 42. The conduction determination means 42 acquires the voltage of the load-side power supply path 61 via the downstream sensing means 36. If a voltage of the main power source 50 that actually should have not been applied to the load-side power supply path 61 is detected from the load-side power supply path 61, then the conduction determination means 42 determines that the switch 20 is in the ON state, and the interruption diagnosis means 44 determines that the switch 20 has a short-circuit fault. On the other hand, if no voltage of the main power source 50 is detected from the load-side power supply path 61, and the conduction determination means 42 determines that the switch 20 is in the OFF state, the interruption diagnosis means 44 determines that the output of the comparator 30 is inconsistent.

Fault Diagnosis when Power Supply Path is in Conduction

Fault diagnosis that is performed after the switch 20 is turned on by the switch control means 41, and before the switch 20 is turned off is performed by a conduction diagnosis means 45 that is provided in the control circuit 40. As a result of the switch 20 being turned on, and the power supply path 60 being brought into conduction, the resistance $R_{on}$ of the switch 20 generates a voltage (voltage drop) $V_{ref}$ based on the magnitude of the electric current I, and an input voltage $V_{in(+)}$ obtained after the voltage drop due to the resistance $R_{on}$ is applied to the plus input terminal of the comparator 30 connected to the load-side power supply path 61.

Since the threshold voltage $V_{in(-)}$ that is compared with this input voltage $V_{in(+)}$ is adjusted so as to be lower than the input voltage $V_{in(+)}$ as long as the electric current I is within a range of normal values, the output value $V_{out}$ of the comparator 30 should be Hi indicating that the input voltage $V_{in(+)}$ is higher than the threshold voltage $V_{in(-)}$, as long as the operation of the comparator 30 and the value of the electric current I are normal. If, at this time, the output value $V_{out}$ is Low, which is the inverted output, it is presumed that an overcurrent has occurred, or a defect has occurred in the switch 20 or the comparator 30. Note that occurrence of an overcurrent is monitored separately by the overcurrent sensing and interrupting means 43, and thus the conduction diagnosis means 45 diagnoses the possibility of an event other than an overcurrent.

If the conduction diagnosis means 45 detects a defect, the conduction determination means 42 determines the actual ON/OFF state of the switch 20. The conduction determination means 42 acquires the voltage of the load-side power supply path 61 via the downstream sensing means 36. If a voltage of the main power source 50 that actually should have been applied to the load-side power supply path 61 is not detected from the load-side power supply path 61, then the conduction determination means 42 determines that the switch 20 is in the OFF state, and the conduction diagnosis means 45 determines that the switch 20 has an open-circuit fault. On the other hand, if the voltage of the main power source 50 is detected from the load-side power supply path 61, and the conduction determination means 42 determined that the switch 20 is in the ON state, the conduction diagnosis means 45 determines that the output $V_{out}$ of the comparator 30 is inconsistent.

The conduction determination means 42 may also determine the voltage of the load-side power supply path 61 based on the binary values of Hi and Low that are obtained by using a resistance voltage divider, a three-terminal regulator, or the like. Alternatively, the conduction determination means 42 may also determine the voltage based on numerical values obtained by using a not-shown A/D converter. As a result of the voltage of the load-side power supply path 61 being converted into a numerical value by the A/D converter, it is possible to perform determination using, as a reference, a lower voltage than in the case of voltage determination simply based on binary values.

The power supply device 10 of the present invention is provided with the downstream sensing means 36 (and the conduction determination means 42), and thus it is possible to directly determine whether or not the switch 20 has correctly reacted in response to the switch control means 41 having turned on/off the switch 20, based on the voltage of the load-side power supply path 61. Accordingly, if a presumed state of the switch and an output of the comparator are inconsistent, then it is possible to determine whether this is caused by a fault of the switch or a fault of the comparator.

An protection operation that is performed when a defect of the switch 20 or the comparator 30 is found in the above-described diagnosis depends on the state of a fault of a component or the characteristics of the connected load 70. Examples of conceivable operations include resetting the control circuit 40, notification of the fault with a buzzer or LED light, immediately interrupting the power supply path 60 if turning off the load 70 does not affect the driving and security of the vehicle, and transmitting a fault signal to a control unit arranged upstream of the power supply device 10 to disconnect the main power source 50 from the power supply device 10 in the case of a short-circuit fault of the switch 20.

A method for identifying a failed component in the fault diagnosis is shown in Table 1.

TABLE 1

| | | | | | | | |
|---|---|---|---|---|---|---|---|
| Switch operation | ON | Y | Y | Y | N | N | N |
| | OFF | N | N | N | Y | Y | Y |
| Comparator output ($V_{out}$) | Hi | Y | N | N | Y | Y | N |
| | Low | N | Y | Y | N | N | Y |
| Conduction determination means | Conduction | — | Y | N | Y | N | — |
| | Interruption | — | N | Y | N | Y | — |
| Normal operation | | X | | | | | X |
| Open-circuit fault of switch | | | | | X | | |
| Short-circuit fault of switch | | | | | | X | |
| Fault of comparator output fixed to Hi | | | | | | | X |
| Fault of comparator output fixed to Low | | | X | | | | |
| Possibility of Overcurrent | | | | X | | | |

Other Embodiments

Figure 4:
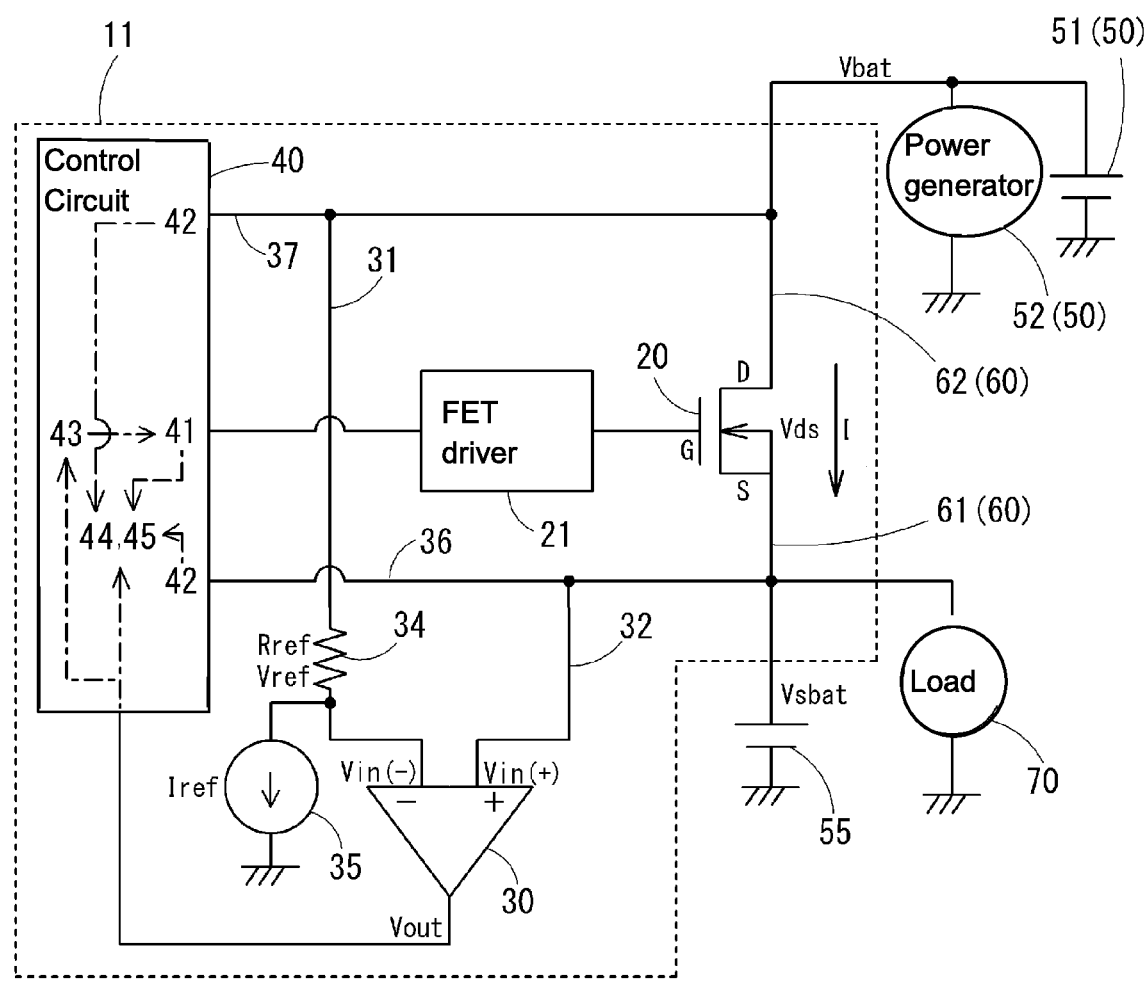
FIG. 4 is a block diagram illustrating an overall configuration of a power supply device according to another embodiment.

Hereinafter, a power supply device 11 according to another embodiment of the power supply device 10 of the present invention will be described. FIG. 4 is a block diagram illustrating an overall configuration of the power supply device 11. Similar to the power supply device 10, the power supply device 11 is installed in a not-shown vehicle, and controls power supply to the load 70 from the main power source 50. In addition, the same reference numerals are given to the same structures as those of the foregoing embodiment, and detailed descriptions thereof are omitted.

A sub (subordinate) power source 55 such as an auxiliary battery is connected to a load-side power supply path 61 of the power supply device 11. Note that in the present embodiment, power supply voltages of a driving battery 51 and the sub power source 55 are both 13[V] when they are fully charged, and a power supply voltage of a power generator 52 is 14[V]. Accordingly, when the power generator 52 is running as the main power source 50, there is a difference in voltage of at least 1[V] between the main power source 50 and the sub power source 55.

In the present embodiment, an upstream sensing means 37, which is a wiring line connected to a main power source-side power supply path 62, is connected to a control circuit 40, the main power source-side power supply path 62 being a power supply path between the switch 20 and the main power source 50. Accordingly, a conduction determination means 42 can acquire not only the voltage of the load-side power supply path 61, but also the voltage of the main power source-side power supply path 62 via the upstream sensing means 37.

Overcurrent Detection Method in Power Supply Device 11

In addition to the main power source 50, the sub power source 55 is connected to the load-side power supply path 61 of the power supply path 60 of the power supply device 11. Accordingly, a larger one of the voltage $V_{bat}$ of the main power source 50 and a voltage $V_{sbat}$ of the sub power source 55 will be applied to the load-side power supply path 61.

However, if an overcurrent occurs, then the resistance of the load 70 is considered to drastically decrease, and thus the voltage $V_{sbat}$ of the sub power source 55 will preferentially be applied to the load 70, and will not reach a wiring line 32. Accordingly, the power supply device 11 as well can detect an overcurrent using the same method as the power supply device 10.

Conduction Determination Method in Power Supply Device 11

As described above, the power supply device 11 is provided with the sub power source 55, and thus it is difficult for the conduction determination means 42 to determine the ON/OFF state of the switch 20 only using the binary values of Hi and Low.

If the switch 20 is in the ON state, and an electric current I of the power supply path 60 is within a range of normal values, the voltage of the power supply path 60 has the characteristic that the voltage of the load-side power supply path 61 and the voltage of the main power source-side power supply path 62 are substantially the same. On the other hand, if the switch 20 is in the OFF state, there is a difference in voltage between these power supply paths due to a difference in amount of charge between the main power source 50 and the sub power source 55, and the like, in contrast to the case where the switch 20 is in the ON state. Furthermore, when the power generator 52 is running as the main power source 50, there is a difference of at least 1[V] between the load-side power supply path 61 and the main power source-side power supply path 62. Accordingly, the conduction determination means 42 of the power supply device 11 uses an A/D converter to convert the voltages of the load-side power supply path 61 and the main power source-side power supply path 62 into numeric values, and compares these values quantitatively and periodically to determine the ON/OFF state of the switch 20 based on a difference in the voltage value between the main power source-side power supply path 62 and the load-side power supply path 61.

Fault Diagnosis Method in Power Supply Device 11

The power supply device 11 can also perform the same fault diagnosis as that of the power supply device 10 except for a conduction determination method. Furthermore, since the power supply device 11 is provided with the sub power source 55, even if the load 70 is running, it is possible to perform fault diagnosis in a state in which the switch 20 is temporarily turned off and the power supply path 60 is interrupted.

Although the embodiments, examples, and comparative examples of the present invention have been described in detail, the present invention is not limited at all to the above-described embodiments and the like, and various modifications are possible within the scope without departing from the essence of the present invention.

The invention claimed is:

1. A power supply device comprising:
   a switch that is disposed in a power supply path leading from a main power source to a load, and is configured to bring into conduction and interrupt the power supply path;
   a downstream sensing means for sensing a power supply state of a load-side power supply path, which is a power supply path between the switch and the load;
   a comparing means for comparing a downstream voltage, which is a voltage of the load-side power supply path, with a predetermined threshold voltage; and
   a control unit to which outputs of the downstream sensing means and the comparing means are input, wherein the control unit includes:
  a switch control means for turning the switch on/off;
  a conduction determination means for determining whether the switch is in an ON or OFF state based on the output of the downstream sensing means; and
an overcurrent sensing means for causing the switch control means to turn the switch off, upon sensing that the downstream voltage is lower than the threshold voltage.

2. The power supply device according to claim 1, wherein the control unit further includes an interruption diagnosis means for determining, in a case where the comparing means indicates that the downstream voltage is higher than the threshold voltage after the switch is turned off by the switch control means, that the switch has a defect if the conduction determination means determines that the switch is in the ON state, and determining that the comparing means has a defect if the conduction determination means determines that the switch is in the OFF state.

3. The power supply device according to claim 1, wherein the control unit further includes a conduction diagnosis means for determining, in a case where the comparing means indicates that the downstream voltage is lower than the threshold voltage after the switch is turned on by the switch control means, that the comparing means has a defect if the conduction determination means determines that the switch is in the ON state, and determining that the switch has a defect if the conduction determination means determines that the switch is in the OFF state.

4. The power supply device according to claim 1, further comprising:
  a sub power source connected to the load-side power supply path; and
  an upstream sensing means for sensing a power supply state of a main power source-side power supply path, which is a power supply path between the switch and the main power source,
  wherein an output of the upstream sensing means is further input to the control unit, and
  the conduction determination means determines whether the switch is in the ON or OFF state based on the outputs of the downstream sensing means and the upstream sensing means.

5. The power supply device according to claim 4, wherein the control unit includes an A/D converter, and the conduction determination means determines whether the switch is in the ON or OFF state based on the outputs of the downstream sensing means and the upstream sensing means that are converted into numeric values by the A/D converter.

6. The power supply device according to claim 2, wherein the control unit further includes a conduction diagnosis means for determining, in a case where the comparing means indicates that the downstream voltage is lower than the threshold voltage after the switch is turned on by the switch control means, that the comparing means has a defect if the conduction determination means determines that the switch is in the ON state, and determining that the switch has a defect if the conduction determination means determines that the switch is in the OFF state.

7. The power supply device according to claim 2, further comprising:
  a sub power source connected to the load-side power supply path; and
  an upstream sensing means for sensing a power supply state of a main power source-side power supply path, which is a power supply path between the switch and the main power source,
  wherein an output of the upstream sensing means is further input to the control unit, and
  the conduction determination means determines whether the switch is in the ON or OFF state based on the outputs of the downstream sensing means and the upstream sensing means.

8. The power supply device according to claim 3, further comprising:
  a sub power source connected to the load-side power supply path; and
  an upstream sensing means for sensing a power supply state of a main power source-side power supply path, which is a power supply path between the switch and the main power source,
  wherein an output of the upstream sensing means is further input to the control unit, and
  the conduction determination means determines whether the switch is in the ON or OFF state based on the outputs of the downstream sensing means and the upstream sensing means.

* * * * *